US012648083B2

(12) United States Patent
Shi et al.

(10) Patent No.: US 12,648,083 B2
(45) Date of Patent: Jun. 2, 2026

(54) DRIVE AND CONTROL INTEGRATED BOARD, CONTROL SYSTEM, AND ROBOT

(71) Applicant: QKM TECHNOLOGY (DONG GUAN) CO., LTD, Songshan Lake Dongguan (CN)

(72) Inventors: Jinbo Shi, Songshan Lake Dongguan (CN); Lihui Chen, Songshan Lake Dongguan (CN); Chunhua Yu, Songshan Lake Dongguan (CN); Qi Sha, Songshan Lake Dongguan (CN); Hong Liu, Songshan Lake Dongguan (CN); Hong Wang, Songshan Lake Dongguan (CN)

(73) Assignee: QKM TECHNOLOGY (DONG GUAN) CO., LTD, Songshan Lake Dongguan (CN)

( * ) Notice: Subject to any disclaimer, the term of this patent is extended or adjusted under 35 U.S.C. 154(b) by 401 days.

(21) Appl. No.: 18/269,599

(22) PCT Filed: May 27, 2021

(86) PCT No.: PCT/CN2021/096266
§ 371 (c)(1),
(2) Date: Jun. 26, 2023

(87) PCT Pub. No.: WO2022/134461
PCT Pub. Date: Jun. 30, 2022

(65) Prior Publication Data
US 2024/0098875 A1      Mar. 21, 2024

(30) Foreign Application Priority Data
Dec. 25, 2020   (CN) .......................... 202011562541.5

(51) Int. Cl.
*H05K 1/14* (2006.01)
*B25J 9/16* (2006.01)

(52) U.S. Cl.
CPC .............. *H05K 1/144* (2013.01); *B25J 9/161* (2013.01); *H05K 2201/041* (2013.01); *H05K 2201/042* (2013.01); *H05K 2201/066* (2013.01)

(58) Field of Classification Search
CPC ............. H05K 1/144; H05K 2201/041; H05K 2201/042; H05K 2201/066; B25J 9/161
See application file for complete search history.

(56) References Cited

U.S. PATENT DOCUMENTS 11,822,300 B2 * 11/2023 Potucek ................. G05B 15/02
2003/0030980 A1      2/2003 Bird et al.
(Continued)

FOREIGN PATENT DOCUMENTS

CN          1341964 A       3/2002
CN        201432298 Y       3/2010
(Continued)

OTHER PUBLICATIONS

International Search Report for corresponding application PCT/CN2021/096266 filed May 27, 2021; Mail date Sep. 8, 2021.
(Continued)

*Primary Examiner* — Zoheb S Imtiaz
(74) *Attorney, Agent, or Firm* — CANTOR COLBURN LLP

(57) ABSTRACT

Provided are a driver controller integrated board, a control system, and a robot. The driver controller integrated board includes a control module (1), a drive module (2), and a first substrate (3). The control module (1) and the drive module (2) are disposed on the first substrate (3), and the control module (1) is electrically connected to the drive module (2).

22 Claims, 8 Drawing Sheets

(56) References Cited

U.S. PATENT DOCUMENTS

| | | | |
|---|---|---|---|
| 2003/0218850 A1 | 11/2003 | Kubo et al. | |
| 2005/0241850 A1 | 11/2005 | Cannon et al. | |
| 2006/0288570 A1 | 12/2006 | Cannon et al. | |
| 2012/0234582 A1 | 9/2012 | Karikalan et al. | |
| 2013/0069494 A1* | 3/2013 | Hattori | F04C 23/008 |
| | | | 310/68 D |
| 2013/0285585 A1* | 10/2013 | Nakajima | H02P 27/06 |
| | | | 318/400.26 |
| 2015/0343636 A1* | 12/2015 | Toda | G05B 19/414 |
| | | | 318/568.11 |
| 2016/0224048 A1* | 8/2016 | Rooyakkers | G09C 1/00 |
| 2017/0066240 A1* | 3/2017 | Hirai | B41J 2/1631 |
| 2020/0375064 A1 | 11/2020 | Chen et al. | |
| 2020/0404790 A1 | 12/2020 | Haraguchi | |
| 2023/0299689 A1* | 9/2023 | Mathesan | H05K 5/006 |
| | | | 318/504 |

FOREIGN PATENT DOCUMENTS

| | | | |
|---|---|---|---|
| CN | 104428197 | A | 3/2015 |
| CN | 205485509 | U | 8/2016 |
| CN | 205717086 | U | 11/2016 |
| CN | 206118273 | U | 4/2017 |
| CN | 106774119 | A | 5/2017 |
| CN | 109571430 | A | 4/2019 |
| CN | 110289676 | A | 9/2019 |
| CN | 209449032 | U | 9/2019 |
| CN | 110911357 | A | 3/2020 |
| CN | 110919623 | A | 3/2020 |
| CN | 111007779 | A | 4/2020 |
| CN | 210589287 | U | 5/2020 |
| CN | 112533461 | A | 3/2021 |
| CN | 112621725 | A | 4/2021 |
| CN | 112621726 | A | 4/2021 |
| CN | 214046493 | U | 8/2021 |
| JP | H01113706 | U | 7/1989 |
| JP | 2008263081 | A | 10/2008 |
| JP | 2015223678 | A | 12/2015 |
| KR | 20040022939 | A | 3/2004 |

OTHER PUBLICATIONS

Chinese Office Action for corresponding application 202011562541.5; Report dated Mar. 4, 2025.

Japanese office action for corresponding Japanese Patent Application 2023-539186; Report dated Jan. 29, 2025.

Chinese Office Action for corresponding application 202011562541.5; Mail date Oct. 20, 2024.

European Search Report for corresponding application EP21908472.0; Mail date Nov. 4, 2024.

Japanese Patent Application No. 2023-539186: Report dated Jun. 27, 2024.

* cited by examiner

DRIVE AND CONTROL INTEGRATED BOARD, CONTROL SYSTEM, AND ROBOT

CROSS-REFERENCE TO RELATED APPLICATIONS

This is a national stage application filed under 37 U.S.C. 371 based on International Patent Application No. PCT/CN2021/096266, filed May 27, 2021, which claims priority to Chinese Patent Application No. 202011562541.5 filed with the China National Intellectual Property Administration (CNIPA) on Dec. 25, 2020, the disclosures of which are incorporated herein by reference in their entireties.

TECHNICAL FIELD

The present application relates to the field of robot control technologies, for example, a driver controller integrated board, a control system, and a robot.

BACKGROUND

Robots are a kind of cross-cutting technology product that integrates mechanical, electrical, and electronic information fields. The robot can replace humans to perform handling, assembly, loading and unloading, palletizing, welding, painting, and other work. The main components of these robots include at least a mechanical body, a reducer, an electric motor, a driver, and a controller. The controller and driver of a common robot on the market are discrete from each other, need to be mounted separately, and take up a lot of space, a lot of installation accessories are consumed, and the signal transmission connection is complicated. In addition, this split design is difficult to satisfy a usage requirement in a narrow space.

SUMMARY

The present application provides a driver controller integrated board, a control system, and a robot so that the integration of a drive function and a control function is achieved and the overall structure of drive and control is more compact.

A driver controller integrated board is provided and includes a control module, a drive module, and a first substrate, where the control module and the drive module are disposed on the first substrate, and the control module is electrically connected to the drive module.

As an optional solution, the driver controller integrated board further includes an isolation device, where the isolation device is disposed between the drive module and the control module.

Optionally, the isolation device is disposed on the first substrate.

Optionally, the isolation device wraps the drive module and/or the control module.

Optionally, the isolation device is one of or a combination of more than two of a magnetic coupler, an optical coupler, or a capacitive isolator.

As an optional solution, an isolation groove is opened on the first substrate and located between the drive module and the control module.

As an optional solution, multiple isolation grooves are disposed between the drive module and the control module; or multiple spacers are disposed in the isolation groove.

Optionally, all the isolation grooves are parallel to each other.

Optionally, all the spacers are parallel to each other.

As an optional solution, the drive module is disposed near the edge of the first end of the first substrate, and the control module is disposed near the edge of the second end of the first substrate.

As an optional solution, the control module and the drive module are disposed on the same side of the first substrate; or the control module is disposed on the first side of the first substrate, and the drive module is disposed on the second side of the first substrate; or the control module includes a first control part and a second control part, where the first control part is disposed on the first side of the first substrate, and the second control part and the drive module are disposed on the second side of the first substrate; or the drive module includes a first drive part and a second drive part, where the first drive part is disposed on the first side of the first substrate, and the second drive part and the control module are disposed on the second side of the first substrate.

Optionally, the first control part is electrically connected to the second control part, and the first control part and/or the second control part are electrically connected to the drive module.

Optionally, the first drive part is electrically connected to the second drive part, and the first drive part and/or the second drive part are electrically connected to the control module.

As an optional solution, the driver controller integrated board further includes a first low-voltage power supply and a first high-voltage power supply that are disposed on the first substrate, where the control module, the first low-voltage power supply, the first high-voltage power supply, and the drive module are adjacent to each other in sequence, or the control module, the first low-voltage power supply, the drive module, and the first high-voltage power supply are adjacent to each other in sequence.

As an optional solution, the driver controller integrated board further includes an input/output (I/O) interface, where the I/O interface is electrically connected to the control module.

As an optional solution, the I/O interface is disposed on a side of the control module facing away from the drive module; or the I/O interface is disposed on a side of the control module facing the drive module; or the I/O interface is disposed on a side of the first low-voltage power supply facing the drive module.

Optionally, the isolation device is located between the first low-voltage power supply and the first high-voltage power supply.

Optionally, the isolation groove is located between the first low-voltage power supply and the first high-voltage power supply.

As an optional solution, the drive module is configured to be connected to an external strong power supply.

As an optional solution, the driver controller integrated board further includes a first communication module disposed on the first substrate, where the first communication module is electrically connected to the control module.

Optionally, the first communication module is disposed on the first side or the second side of the first substrate.

Optionally, the first communication module is located between the control module and the drive module. Optionally, the first communication module is disposed near the control module.

Optionally, the first communication module is located between the first low-voltage power supply and the first high-voltage power supply.

Optionally, the first communication module is located on a side of the isolation device or the isolation groove facing the control module.

As an optional solution, the first communication module is configured to be connected to a network bus.

As an optional solution, the driver controller integrated board further includes two heat dissipation assemblies, where the two heat dissipation assemblies are disposed on the first substrate, one of the two heat dissipation assemblies is located on a side of the control module facing away from the drive module, and another one of the two heat dissipation assemblies is located on a side of the drive module facing away from the control module.

As an optional solution, the driver controller integrated board further includes at least one heat dissipation assembly, where the at least one heat dissipation assembly is disposed on the first substrate.

As an optional solution, each of the at least one heat dissipation assembly includes a heat dissipation base plate and multiple cooling fins, where the heat dissipation base plate is mounted on the first substrate, and the multiple cooling fins are mounted on the heat dissipation base plate.

Optionally, the heat dissipation base plate and the multiple cooling fins are disposed between the drive module and the control module.

As an optional solution, the heat dissipation base plate abuts against the drive module and/or the control module.

As an optional solution, the heat dissipation base plate is connected to the control module and/or the drive module through thermally conductive silicone.

As an optional solution, each of the at least one heat dissipation assembly further includes a first fan, where the first fan is mounted on a side of the multiple cooling fins and capable of driving gas to flow in a region where the multiple cooling fins are located.

As an optional solution, each of the at least one heat dissipation assembly includes a second fan, where the second fan is disposed at the edge of the first substrate.

As an optional solution, the driver controller integrated board further includes a heat dissipation assembly, where the heat dissipation assembly is disposed on the first substrate.

As an optional solution, each of the at least one heat dissipation assembly includes a heat dissipation base plate and multiple cooling fins, where the heat dissipation base plate is mounted on the first substrate, and the multiple cooling fins are mounted on the heat dissipation base plate.

As an optional solution, the heat dissipation base plate abuts against the drive module and/or the control module and/or the first communication module.

As an optional solution, the heat dissipation base plate is connected to the control module and/or the drive module and/or the first communication module through thermally conductive silicone.

As an optional solution, each of the at least one heat dissipation assembly further includes a first fan, where the first fan is mounted on a side of the multiple cooling fins and capable of driving gas to flow in a region where the multiple cooling fins are located.

As an optional solution, each of the at least one heat dissipation assembly includes a second fan, where the second fan is disposed at the edge of the first substrate.

As an optional solution, the driver controller integrated board further includes a safety circuit module, where the safety circuit module is disposed on the first substrate and electrically connected to the control module and/or the drive module.

Optionally, the safety circuit module is electrically connected to the first communication module.

As an optional solution, the driver controller integrated board further includes a thermal insulation member, where the thermal insulation member is disposed between the drive module and the control module.

Optionally, the thermal insulation member is a hollow structural member.

Optionally, the thermal insulation member is located between the first low-voltage power supply and the first high-voltage power supply.

Optionally, the thermal insulation member is the same structural member as the isolation device.

Optionally, the thermal insulation member is disposed in the isolation groove.

Optionally, the first communication module is located on a side of the thermal insulation member facing the control module.

As an optional solution, the drive module fits the first substrate, the first communication module fits a side of the drive module facing away from the first substrate, and the control module fits a side of the first communication module facing away from the first substrate.

As an optional solution, the control module fits the first substrate, and the drive module is parallel to the control module and fits the first substrate; or the control module fits the first substrate, and the drive module fits a side of the control module facing away from the first substrate; or the drive module fits the first substrate, and the control module fits a side of the drive module facing away from the first substrate.

A driver controller integrated board is disclosed and includes a first substrate and a second substrate that are integrated, where the first substrate is a control function board, the second substrate is a drive function board, and the first substrate is electrically connected to the second substrate.

As an optional solution, the second substrate and the first substrate are stacked.

As an optional solution, the second substrate fits and is connected to the first substrate in a daisy chain.

As an optional solution, the driver controller integrated board further includes an isolation device, where the isolation device is disposed between the second substrate and the first substrate.

As an optional solution, the driver controller integrated board further includes a first low-voltage power supply and a first high-voltage power supply, where the first substrate, the first low-voltage power supply, the first high-voltage power supply, and the second substrate are adjacent to each other in sequence, or the first substrate, the first low-voltage power supply, the second substrate, and the first high-voltage power supply are adjacent to each other in sequence.

As an optional solution, the driver controller integrated board further includes an input/output (I/O) interface, where the I/O interface is electrically connected to the first substrate.

As an optional solution, the I/O interface is disposed on a side of the first substrate facing away from the second substrate; or the I/O interface is disposed on a side of the first substrate facing the second substrate; or the I/O interface is disposed on a side of the first low-voltage power supply facing the second substrate.

As an optional solution, the second substrate is configured to be connected to an external strong power supply.

As an optional solution, the driver controller integrated board further includes a communication module, where the communication module is electrically connected to the first substrate.

As an optional solution, the communication module is configured to be connected to a network bus.

As an optional solution, the driver controller integrated board further includes at least one heat dissipation assembly configured to dissipate heat from the first substrate and/or the second substrate.

As an optional solution, two heat dissipation assemblies are provided, one of the two heat dissipation assemblies is located on a side of the first substrate facing away from the second substrate, and the other one of the two heat dissipation assemblies is located on a side of the second substrate facing away from the first substrate.

As an optional solution, one heat dissipation assembly is provided, where the heat dissipation assembly is disposed between the second substrate and the first substrate; or the heat dissipation assembly abuts against the first substrate; or the heat dissipation assembly abuts against the second substrate.

As an optional solution, each of the at least one heat dissipation assembly includes a heat dissipation base plate and multiple cooling fins, where the heat dissipation base plate is mounted on one of the second substrate or the first substrate, the multiple cooling fins are mounted on the heat dissipation base plate, and the other one of the second substrate or the first substrate fits the multiple cooling fins.

As an optional solution, the heat dissipation base plate is connected to the first substrate or the second substrate through thermally conductive silicone.

As an optional solution, each of the at least one heat dissipation assembly further includes a cooling fan, where the cooling fan is mounted on a side of the multiple cooling fins and capable of driving gas to flow in a region where the multiple cooling fins are located.

As an optional solution, the driver controller integrated board further includes a thermal insulation member, where the thermal insulation member is disposed between the second substrate and the first substrate.

As an optional solution, the number of first substrates is equal to the number of second substrates, and the first substrates are electrically connected to the second substrates in one-to-one correspondence; or the number of first substrates is less than the number of second substrates, and at least one of the first substrates is electrically connected to more than two of the second substrates.

A control system is provided and includes the preceding driver controller integrated board.

As an optional solution, the control system further includes a signal adapter board, a second low-voltage power supply, and a second high-voltage power supply, where two driver controller integrated boards are provided, and one of the two driver controller integrated boards, the signal adapter board, the second low-voltage power supply, the second high-voltage power supply, and the other one of the two driver controller integrated boards are cascaded in sequence.

Optionally, the driver controller integrated board adjacent to the signal adapter board is configured to implement only a control function and may be replaced with a conventional single control board; and the driver controller integrated board adjacent to the second high-voltage power supply is configured to implement only a drive function and may be replaced with a conventional single drive board.

As an optional solution, the control system further includes two heat sinks, where one of the two heat sinks is located on a side of one of the two driver controller integrated boards facing away from the signal adapter board, and the other one of the two heat sinks is located on a side of the other one of the two driver controller integrated boards facing away from the second high-voltage power supply.

As an optional solution, at least two driver controller integrated boards are provided, and all the at least two driver controller integrated boards are spaced apart along a column, stacked, and connected in cascade in sequence, or all the at least two driver controller integrated boards are spaced apart along two columns, stacked, and connected in cascade in sequence.

As an optional solution, any of the at least two driver controller integrated boards is capable of acting as a master control board, is configured to control the signals from all the at least two driver controller integrated boards, and is connected to an external device signal; or all the at least two driver controller integrated boards are configured to be connected to a cloud controller, where the cloud controller is configured to control the signals from all the at least two driver controller integrated boards and is connected to an external device signal.

As an optional solution, the control system further includes a connecting plate, where the connecting plate and the driver controller integrated boards are spaced apart and stacked, the connecting plate includes a third control part and a third substrate, the third control part is disposed on the third substrate, all the driver controller integrated boards are connected in cascade in sequence, and the third control part is electrically connected to at least one driver controller integrated board.

Optionally, the connecting plate is disposed on a side of the whole formed by all the driver controller integrated boards located in a column, facilitating the connection between the connecting plate and an external controller.

As an optional solution, the connecting plate further includes a second communication module, where the second communication module is disposed on the third substrate, and the third control part is electrically connected to the second communication module.

As an optional solution, the control system further includes a connecting seat, where the connecting seat includes more than two first cascade sockets for the driver controller integrated boards to be plugged in, and all the more than two first cascade sockets are spaced apart from each other by an equal distance along a column and connected in cascade in sequence, or all the more than two first cascade sockets are spaced apart along two columns, stacked, and connected in cascade in sequence.

As an optional solution, the control system further includes a connecting seat, where the connecting seat includes more than two first cascade sockets for the driver controller integrated boards to be plugged in and one second cascade socket for the connecting plate to be plugged in, all the more than two first cascade sockets are spaced apart from each other by an equal distance along a column and connected in cascade in sequence or all the more than two first cascade sockets are spaced apart along two columns, stacked, and connected in cascade in sequence, and the second cascade socket is electrically connected to at least one of the more than two first cascade sockets.

Optionally, the second cascade socket is disposed on a side of the whole formed by the first cascade sockets in a column, facilitating the connection between the second cascade socket and the external controller.

As an optional solution, the second cascade socket is electrically connected to one of the at least two first cascade sockets adjacent to the second cascade socket.

As an optional solution, the control system further includes a connecting seat, where the connecting seat includes more than two first cascade sockets for the driver controller integrated boards to be plugged in, all the more than two first cascade sockets are spaced apart from each other by an equal distance along a column and connected in cascade in sequence or all the more than two first cascade sockets are spaced apart along two columns, stacked, and connected in cascade in sequence, the connecting plate is welded or affixed to the connecting seat, and the connecting plate is electrically connected to at least one of the more than two first cascade sockets.

Optionally, the connecting plate is disposed on a side of the whole formed by all the first cascade sockets in a column, facilitating the connection between the connecting plate and the external controller.

As an optional solution, the connecting plate is electrically connected to one of the at least two first cascade sockets adjacent to the connecting plate.

As an optional solution, a main substrate is further included, where all the at least two driver controller integrated boards are welded or affixed to the main substrate.

As an optional solution, a main substrate is further included, where the connecting plate and/or all the at least two driver controller integrated boards are welded or affixed to the main substrate.

As an optional solution, the control system further includes a thermostat, where the thermostat is configured to perform high-temperature protection on the driver controller integrated board.

Another control system is provided and includes a control function board, a drive function board, a signal adapter board, a second low-voltage power supply, and a second high-voltage power supply, where the control function board, the drive function board, the signal adapter board, the second low-voltage power supply, and the second high-voltage power supply are connected in a daisy chain.

As an optional solution, one control function board is provided, one drive function board is provided, and the control function board, the signal adapter board, the second low-voltage power supply, the second high-voltage power supply, and the drive function board are cascaded in sequence, or the control function board, the signal adapter board, the second low-voltage power supply, the drive function board, and the second high-voltage power supply are cascaded in sequence.

As an optional solution, the control system further includes two heat sinks, where one of the two heat sinks is located on a side of the control function board facing away from the drive control board, and the other one of the two heat sinks is located on a side of the drive function board facing away from the control function board.

As an optional solution, the control function board and/or the drive function board is the preceding driver controller integrated board.

A robot is provided and includes the preceding control system.

BRIEF DESCRIPTION OF DRAWINGS

The present application is described below according to drawings and embodiments.

REFERENCE LIST

Figure 9:
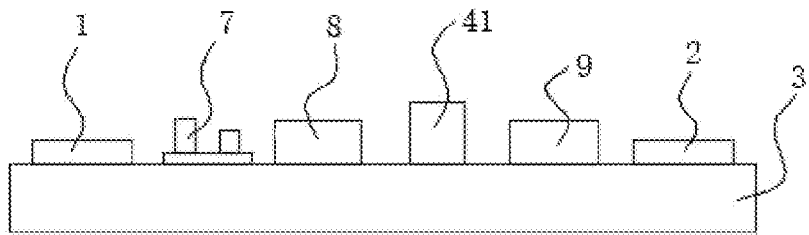
FIG. 9 is a structural diagram of a driver controller integrated board according to embodiment three.
Figure 10:
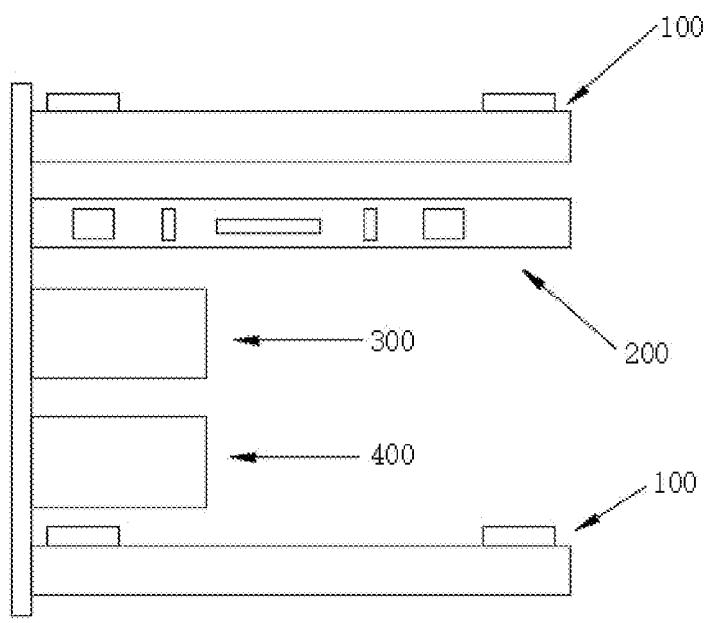
FIG. 10 is a structural diagram of a control system according to embodiment seven.
Figure 11:
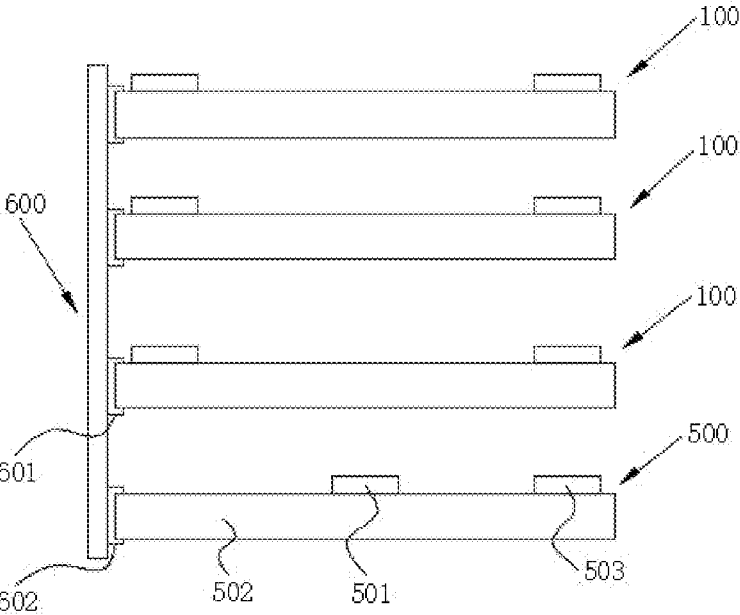
FIG. 11 is a structural diagram of a control system according to embodiment nine.
Figure 12:
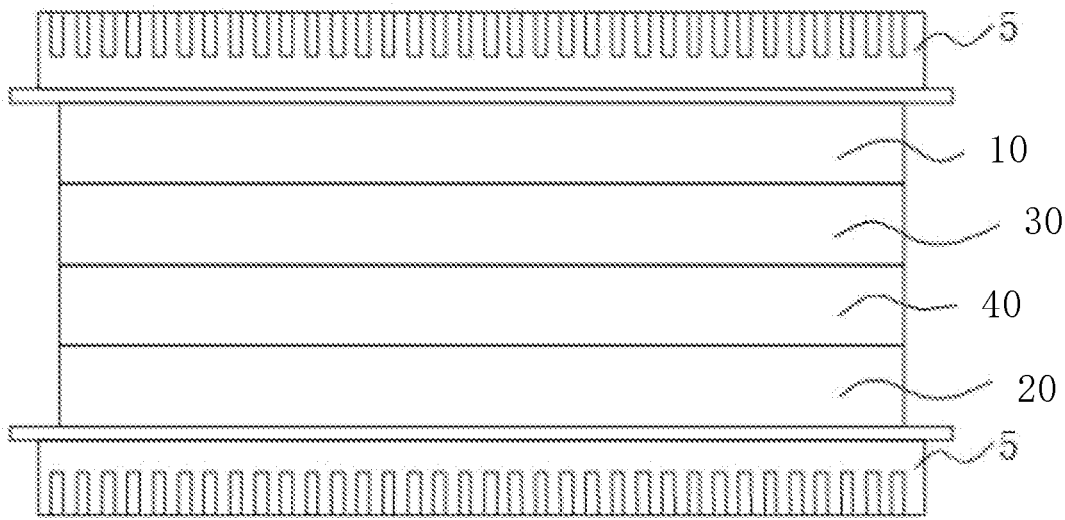
FIG. 12 is a structural diagram of a driver controller integrated board according to embodiment six.

In FIGS. 1 to 15
100 driver controller integrated board
1 control module
11 first control part
12 second control part
2 drive module
21 first drive part
22 second drive part
3 first substrate
41 isolation device
42 isolation groove
5 heat dissipation assembly
51 heat dissipation base plate
52 cooling fin
6 first fan
7 I/O interface
8 first low-voltage power supply
9 first high-voltage power supply
200 signal adapter board
300 second low-voltage power supply
400 second high-voltage power supply
500 connecting plate
501 third control part
502 third substrate
503 second communication module
600 connecting seat
601 first cascade socket
602 second cascade socket
In FIG. 12
10 first substrate
20 second substrate
30 first low-voltage power supply

9

Figure 1:
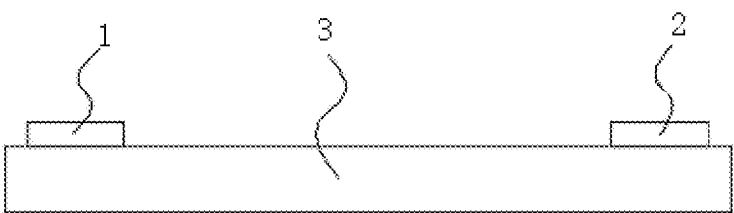
FIG. 1 is a first structural diagram of a driver controller integrated board according to embodiment one.
Figure 16:
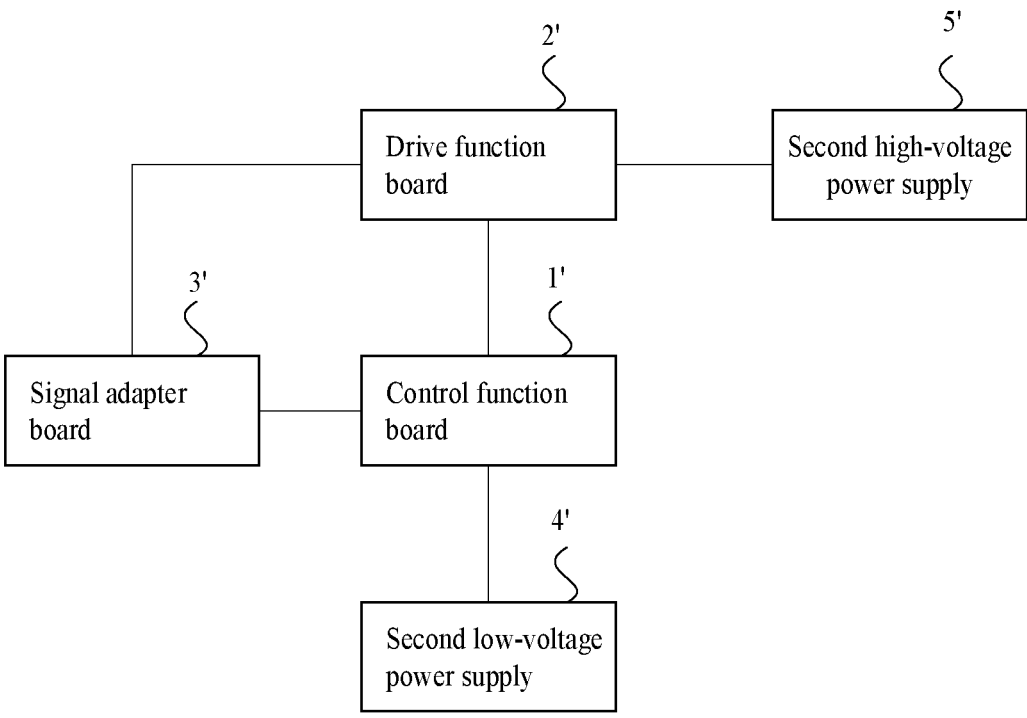
FIG. 16 is a structural diagram of a control system according to embodiment twelve.

40 first high-voltage power supply
5 heat dissipation assembly
In FIG. 16
1' control function board
2' drive function board
3' signal adapter board
4' second low-voltage power supply
5' second high-voltage power supply

DETAILED DESCRIPTION

Technical solutions in embodiments of the present application are described below in conjunction with the drawings. Apparently, the described embodiments are merely part, not all of the embodiments of the present application.

In the description of the present application, the terms "joined", "connected", and "fixed" are to be understood in a broad sense unless otherwise expressly specified and limited. For example, the term "connected" may refer to "fixedly connected", "detachably connected", or integrated, may refer to "mechanically connected" or "electrically connected", or may refer to "connected directly", "connected indirectly through an intermediary", "connected inside two elements", or "interaction relations between two elements". For those of ordinary skill in the art, meanings of the preceding terms in the present application may be understood based on situations.

In the present application, unless otherwise expressly specified and limited, when a first feature is described as "on" or "below" a second feature, the first feature and the second feature may be in direct contact or be in contact via another feature between the two features instead of being in direct contact. Moreover, when the first feature is described as "on", "above", or "over" the second feature, the first feature is right on, above, or over the second feature or the first feature is obliquely on, above, or over the second feature, or the first feature is simply at a higher level than the second feature. When the first feature is described as "under", "below", or "underneath" the second feature, the first feature is right under, below, or underneath the second feature or the first feature is obliquely under, below, or underneath the second feature, or the first feature is simply at a lower level than the second feature.

The technical solutions of the present application are described hereinafter in conjunction with drawings and embodiments.

Embodiment One

As shown in FIG. 1, a driver controller integrated board includes a control module 1, a drive module 2, and a first substrate 3, where the control module 1 and the drive module 2 are disposed on the first substrate 3, and the control module 1 is electrically connected to the drive module 2. The control module 1 and the drive module 2 are disposed on the same substrate so that the overall structure of the control module 1 and the drive module 2 is more compact, which is conducive to the miniaturization of the device to which the control module 1 and the drive module 2 are applied.

Optionally, the control module 1 is configured to send a control signal to the drive module 2, and the drive module 2 is configured to drive a driven part to move according to the control signal. For example, the driven part is a mechanical arm.

In this embodiment, the control module 1 fits the first substrate 3, and the drive module 2 is parallel to the control module 1 and fits the first substrate 3. In other embodiments, the design may also be as follows: the control module fits the first substrate and the drive module fits a side of the control module facing away from the first substrate; or the drive module fits the first substrate and the control module fits a side of the drive module facing away from the first substrate.

Figure 2:
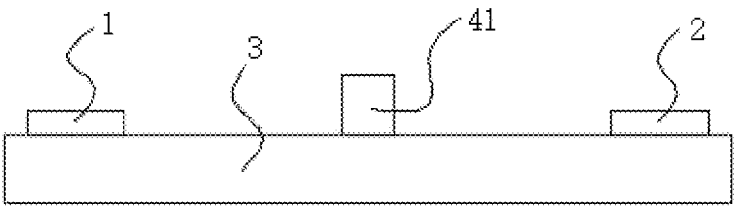
FIG. 2 is a second structural diagram of a driver controller integrated board according to embodiment one.

Optionally, as shown in FIG. 2, a driver controller integrated board 100 further includes an isolation device 41, where the isolation device 41 is disposed between the drive module 2 and the control module 1. The isolation device 41 is configured to isolate the drive module 2 and the control module 1 to avoid the interference between strong and weak power, thereby improving the working reliability of each of the drive module 2 and the control module 1. The isolation device 41 is disposed on the first substrate 3. In other embodiments, the isolation device 41 may wrap the drive module 2 and/or the control module 1.

Optionally, the isolation device 41 is one of or a combination of more than two of a magnetic coupler, an optical coupler, or a capacitive isolator.

Optionally, the drive module 2 is disposed near the edge of the first end of the first substrate 3, and the control module 1 is disposed near the edge of the second end of the first substrate 3. The drive module 2 and the control module 1 are disposed at opposite ends facing away from each other, which is conducive to reducing the interference between the drive module 2 and the control module 1.

Figure 3:
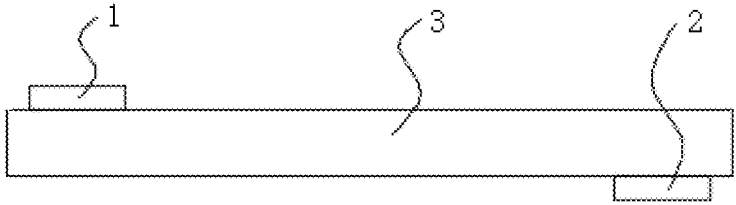
FIG. 3 is a third structural diagram of a driver controller integrated board according to embodiment one.
Figure 4:
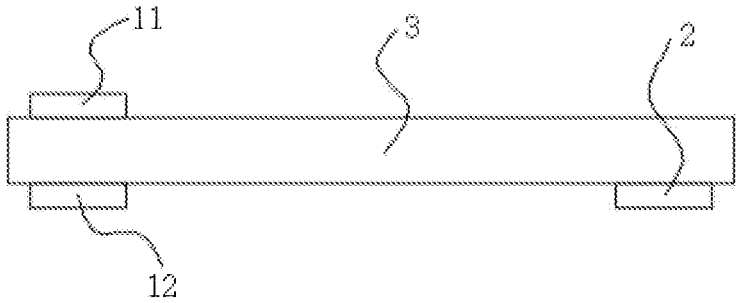
FIG. 4 is a fourth structural diagram of a driver controller integrated board according to embodiment one.
Figure 5:
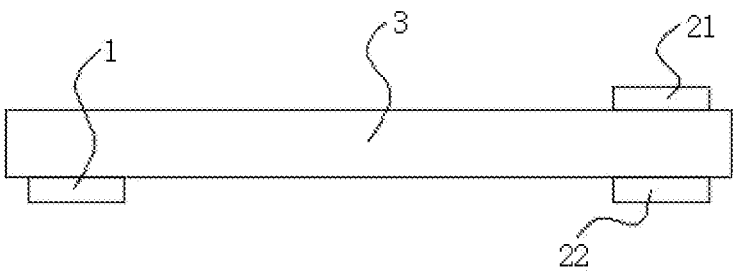
FIG. 5 is a fifth structural diagram of a driver controller integrated board according to embodiment one.

Optionally, the control module 1 and the drive module 2 are disposed on the same side of the first substrate 3. In other embodiments, the design may also be as follows: as shown in FIG. 3, the control module 1 is disposed on the first side of the first substrate 3, and the drive module 2 is disposed on the second side of the first substrate 3; or as shown in FIG. 4, the control module 1 includes a first control part 11 and a second control part 12, where the first control part 11 is disposed on the first side of the first substrate 3, and the second control part 12 and the drive module 2 are disposed on the second side of the first substrate 3; the first control part 11 and the second control part 12 are electrically connected, and the first control part 11 and/or the second control part 12 are electrically connected to the drive module 2; or as shown in FIG. 5, the drive module 2 includes a first drive part 21 and a second drive part 22, where the first drive part 21 is disposed on the first side of the first substrate 3, and the second drive part 22 and the control module 1 are disposed on the second side of the first substrate 3; the first drive part 21 and the second drive part 22 are electrically connected, and the first drive part 21 and/or the second drive part 22 are electrically connected to the control module 1. The control module 1 and the drive module 2 act as a heat source, and the control module 1 is divided into two parts or the drive module 2 is divided into two parts so that the heat source is more dispersed, which is conducive to avoiding overheating at a local position, thereby effectively improving the working reliability of the driver controller integrated board 100.

Optionally, the drive module 2 can be directly connected to an external strong power supply, thereby improving the flexibility of the connection and usage of the driver controller integrated board 100.

Figure 6:
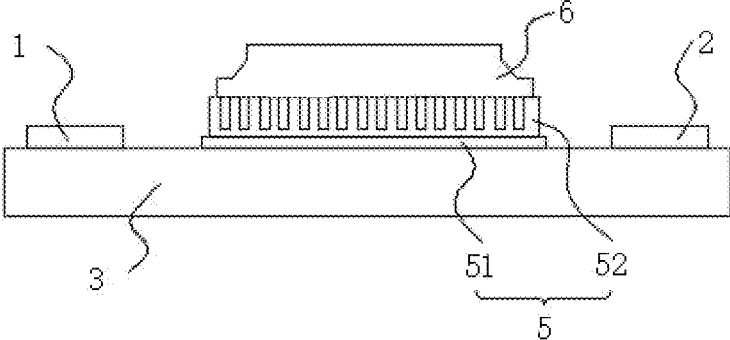
FIG. 6 is a sixth structural diagram of a driver controller integrated board according to embodiment one.

Optionally, as shown in FIG. 6, the driver controller integrated board 100 further includes at least one heat dissipation assembly 5, where the heat dissipation assembly 5 is disposed on the first substrate 3. The heat dissipation assembly 5 can dissipate the heat from the control module 1 and the drive module 2, thereby ensuring the working reliability of the control module 1 and the drive module 2 and extending the service life.

Figure 7:
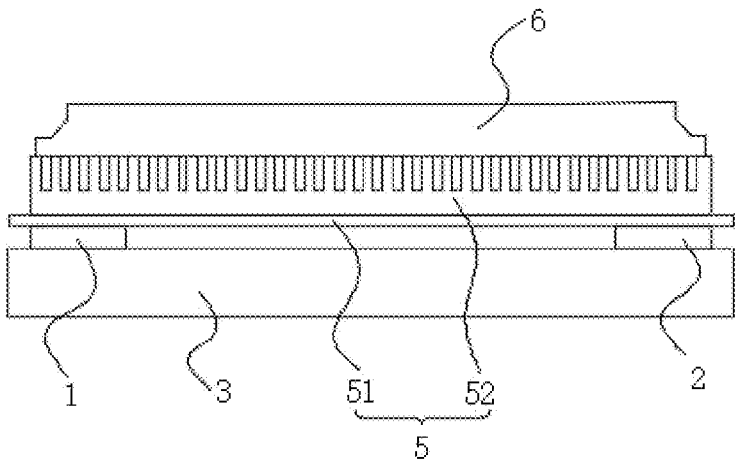
FIG. 7 is a seventh structural diagram of a driver controller integrated board according to embodiment one.

Optionally, the heat dissipation assembly 5 includes a heat dissipation base plate 51 and multiple cooling fins 52, where the heat dissipation base plate 51 is mounted on the first substrate 3, and the multiple cooling fins 52 are mounted on the heat dissipation base plate 51. As shown in FIG. 6, the heat dissipation base plate 51 and the cooling fins 52 are disposed between the drive module 2 and the control module 1, or as shown in FIG. 7, the heat dissipation base plate 51 abuts against the drive module 2 and/or the control module 1, and the heat dissipation base plate 51 is connected to the control module 1 and/or the drive module 2 through thermally conductive silicone, thereby improving the heat dissipation effect. The heat dissipation assembly is directly connected to the control module and/or the drive module for heat transfer, thereby improving the heat dissipation effect.

Optionally, the heat dissipation assembly 5 further includes a first fan 6, where the first fan 6 is mounted on a side of the cooling fins 52 and capable of driving the gas to flow in a region where the cooling fins 52 are located.

Optionally, the heat dissipation assembly 5 includes a second fan, where the second fan is disposed at the edge of the first substrate 3. The second fan is disposed at the edge so that the overall design difficulty and manufacturing process of the driver controller integrated board 100 can be simplified, which is conducive to the promotion and application of the driver controller integrated board 100.

Optionally, the driver controller integrated board 100 further includes a safety circuit module, where the safety circuit module is disposed on the first substrate 3 and electrically connected to the control module 1 and/or the drive module 2. The safety circuit module is provided to protect the control module 1 and/or the drive module 2, thereby improving the working reliability of the control module 1 and/or the drive module 2. Provided that a first communication module is provided, the safety circuit module is electrically connected to the first communication module and protects the first communication module.

Optionally, the driver controller integrated board 100 further includes a thermal insulation member, where the thermal insulation member is disposed between the drive module 2 and the control module 1. The thermal insulation member can reduce the heat transfer between the drive module 2 and the control module 1, thereby ensuring the reliability of respective independent operations of the drive module 2 and the control module 1.

Optionally, the thermal insulation member is a hollow structural member.

Optionally, the thermal insulation member is the same structural member as the isolation device 41.

Embodiment Two

This embodiment differs from embodiment one in that the isolation device 41 in embodiment one is replaced with the design described below.

Figure 8:
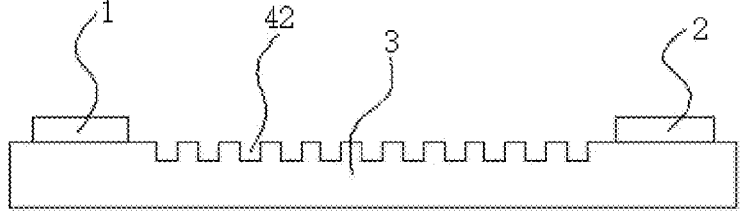
FIG. 8 is a structural diagram of a driver controller integrated board according to embodiment two.

As shown in FIG. 8, isolation grooves 42 are opened on the first substrate 3 and located between the drive module 2 and the control module 1. The isolation grooves 42 create air isolation between the drive module 2 and the control module 1, allowing the interference signal to switch between two different media (solid and gas) for the interference signal to pass through and creating an obstruction to the interference signal, which is conducive to reducing the mutual interference between the drive module 2 and the control module 1.

Optionally, multiple isolation grooves 42 are disposed between the drive module 2 and the control module 1 and all the isolation grooves 42 are parallel to each other; or multiple spacers are disposed in the isolation groove 42 and all the spacers are parallel to each other. Multiple isolation grooves 42 or multiple spacers are provided so that the interference signal can repeatedly switch between solid and gas media many times, thereby improving the effect of blocking the interference signal.

Optionally, the thermal insulation member in embodiment one may be disposed in the isolation groove 42.

Embodiment Three

This embodiment differs from embodiment one or embodiment two in the aspects described below.

As shown in FIG. 9, the driver controller integrated board 100 further includes an I/O interface 7, a first low-voltage power supply 8, and a first high-voltage power supply 9 that are disposed on the first substrate 3, where the control module 1, the I/O interface 7, the first low-voltage power supply 8, the first high-voltage power supply 9, and the drive module 2 are adjacent to each other in sequence. The control module 1, the I/O interface 7, the first low-voltage power supply 8, the first high-voltage power supply 9, and the drive module 2 are adjacent to each other in sequence so that on the one hand, the connection distance between the control module 1 and the I/O interface 7 can be reduced; on the other hand, the space between the control module 1 and the drive module 2 can be fully used, the first low-voltage power supply 8 is close to the control module 1, the first high-voltage power supply 9 is close to the drive module 2, and power can be supplied to the control module 1 and the drive module 2 in a more efficient and reliable manner. In other embodiments, the design may also be as follows: the I/O interface is disposed on a side of the control module facing away from the drive module; or the I/O interface is disposed on a side of the first low-voltage power supply facing the drive module.

Optionally, the first low-voltage power supply 8 is electrically connected to the control module 1, the first low-voltage power supply 8 is configured to supply power to the control module 1, the first high-voltage power supply 9 is electrically connected to the drive module 2, and the first high-voltage power supply 9 is configured to supply power to the drive module 2.

Optionally, the isolation device 41 or the isolation groove 42 is located between the first low-voltage power supply 8 and the first high-voltage power supply 9.

Optionally, the driver controller integrated board 100 further includes two heat dissipation assemblies 5, where the two heat dissipation assemblies 5 are disposed on the first substrate 3, one of the two heat dissipation assemblies 5 is located on a side of the control module 1 facing away from the drive module 2, and the other one of the two heat dissipation assemblies 5 is located on a side of the drive module 2 facing away from the control module 1. The two heat dissipation assemblies 5 are disposed on the outer side of two ends and adjacent to the control module 1 and the drive module 2 separately, which is conducive to improving the heat dissipation effect.

Embodiment Four

This embodiment differs from embodiment one, embodiment two, or embodiment three in the aspects described below.

Optionally, the driver controller integrated board further includes the first communication module disposed on the first substrate 3, where the first communication module is electrically connected to the control module 1. The first communication module is provided so that the remote connection between the control module 1 and the external device can be achieved, thereby improving the usage flexibility and applicability of the driver controller integrated board 100.

Optionally, the first communication module is disposed on the first side or the second side of the first substrate 3.

Optionally, the first communication module is located between the control module 1 and the drive module 2. The first communication module is disposed near the control module 1.

Optionally, the first communication module is located between the first low-voltage power supply 8 and the first high-voltage power supply 9.

Optionally, the first communication module is located on a side of the isolation device 41 or the isolation groove 42 facing the control module 1.

Optionally, the first communication module is configured to be connected to a network bus.

Optionally, the drive module 2 fits the first substrate 3, the first communication module fits a side of the drive module 2 facing away from the first substrate 3, and the control module 1 fits a side of the first communication module facing away from the first substrate 3.

Optionally, the driver controller integrated board 100 further includes the heat dissipation assembly 5, where the heat dissipation assembly 5 is disposed on the first substrate 3. The heat dissipation assembly 5 can dissipate the heat from the control module 1 and the drive module 2, thereby ensuring the working reliability of the control module 1 and the drive module 2 and extending the service life.

Optionally, the heat dissipation assembly 5 includes the heat dissipation base plate 51 and multiple cooling fins 52, where the heat dissipation base plate 51 is mounted on the first substrate 3, and the multiple cooling fins 52 are mounted on the heat dissipation base plate 51. The heat dissipation base plate 51 and the cooling fins 52 are disposed between the drive module 2 and the control module 1, or the heat dissipation base plate 51 abuts against the drive module 2 and/or the control module 1 and/or the first communication module and the heat dissipation base plate 51 is connected to the control module 1 and/or the drive module 2 and/or the first communication module through thermally conductive silicone, thereby improving the heat dissipation effect.

Embodiment Five

This embodiment differs from embodiment one or embodiment two in the aspects described below.

The driver controller integrated board further includes an I/O interface, a first low-voltage power supply, and a first high-voltage power supply that are disposed on the first substrate, where the control module and the drive module are parallel to each other on the first substrate, the I/O interface is mounted on a side of the control module facing away from the first substrate, the first low-voltage power supply is mounted on a side of the I/O interface facing away from the first substrate, and the first high-voltage power supply is mounted on a side of the drive module facing away from the first substrate. The control module, the I/O interface, and the first low-voltage power supply are adjacent to each other so that the connection distance between the control module and the I/O interface can be reduced, the first low-voltage power supply is close to the control module, the first high-voltage power supply is close to the drive module, and power can be supplied to the control module and the drive module in a more efficient and reliable manner.

Optionally, the driver controller integrated board further includes two heat dissipation assemblies, where the heat dissipation assemblies are disposed on the first substrate, one of the two heat dissipation assemblies is located on a side of the control module facing away from the drive module, and the other one of the two heat dissipation assemblies is located on a side of the drive module facing away from the control module. The two heat dissipation assemblies are disposed on the outer side of two ends and adjacent to the control module and the drive module separately, which is conducive to improving the heat dissipation effect.

Embodiment Six

As shown in FIG. 12, a driver controller integrated board includes a first substrate 10 and a second substrate 20 that are integrated, where the first substrate 10 is a control function board, the second substrate 20 is a drive function board, and the first substrate 10 is electrically connected to the second substrate 20.

Optionally, the second substrate 20 and the first substrate 10 are stacked. The second substrate 20 fits and is connected to the first substrate 10 in a daisy chain.

Optionally, the first substrate 10 is configured to send a control signal to the second substrate 20, and the second substrate 20 is configured to drive a driven part to move according to the control signal. For example, the driven part is a mechanical arm.

Optionally, the driver controller integrated board further includes an isolation device, where the isolation device is disposed between the second substrate 20 and the first substrate 10. The isolation device is configured to isolate the first substrate 10 and the second substrate 20 to avoid the interference between strong and weak power, thereby improving the working reliability of each of the first substrate 10 and the second substrate 20.

Optionally, the driver controller integrated board further includes a first low-voltage power supply 30 and a first high-voltage power supply 40, where the first substrate 10, the first low-voltage power supply 30, the first high-voltage power supply 40, and the second substrate 20 are adjacent to each other in sequence, or the first substrate 10, the first low-voltage power supply 30, the second substrate 20, and the first high-voltage power supply 40 are adjacent to each other in sequence. The driver controller integrated board further includes an I/O interface, where the I/O interface is electrically connected to the first substrate 10. The I/O interface is disposed on a side of the first substrate 10 facing away from the second substrate 20; or the I/O interface is disposed on a side of the first substrate 10 facing the second substrate 20; or the I/O interface is disposed on a side of the first low-voltage power supply 30 facing the second substrate 20.

Optionally, the first low-voltage power supply 30 is electrically connected to the first substrate 10, the first low-voltage power supply 30 is configured to supply power to the first substrate 10, the first high-voltage power supply 40 is electrically connected to the second substrate 20, and the first high-voltage power supply 40 is configured to supply power to the second substrate 20.

Optionally, the second substrate 20 is configured to be connected to an external strong power supply.

Optionally, the driver controller integrated board further includes a communication module, where the communication module is electrically connected to the first substrate 10. The communication module is configured to be connected to a network bus.

Optionally, the driver controller integrated board further includes at least one heat dissipation assembly 5 configured to dissipate the heat from the first substrate 10 and/or the second substrate 20.

Optionally, two heat dissipation assemblies 5 of the driver controller integrated board are provided, one of the two heat dissipation assemblies 5 is located on a side of the first substrate 10 facing away from the second substrate 20, and the other one of the two heat dissipation assemblies 5 is located on a side of the second substrate 20 facing away from the first substrate 10.

Optionally, one heat dissipation assembly 5 of the driver controller integrated board is provided, where the heat dissipation assembly 5 is disposed between the second substrate 20 and the first substrate 10; or the heat dissipation assembly 5 abuts against the first substrate 10; or the heat dissipation assembly 5 abuts against the second substrate 20.

Optionally, the heat dissipation assembly 5 includes a heat dissipation base plate and multiple cooling fins, where the heat dissipation base plate is mounted on one of the second substrate 20 or the first substrate 10, the cooling fins are mounted on the heat dissipation base plate, and the other one of the second substrate 20 or the first substrate 10 fits the cooling fins.

Optionally, the heat dissipation base plate is connected to the first substrate 10 or the second substrate 20 through thermally conductive silicone.

Optionally, the heat dissipation assembly 5 further includes a cooling fan, where the cooling fan is mounted on a side of the cooling fins and capable of driving the gas to flow in a region where the cooling fins are located.

Optionally, the driver controller integrated board further includes a thermal insulation member, where the thermal insulation member is disposed between the second substrate 20 and the first substrate 10.

Optionally, the number of first substrates 10 is equal to the number of second substrates 20, and the first substrates 10 are electrically connected to the second substrates 20 in one-to-one correspondence; or the number of first substrates 10 is less than the number of second substrates 20, and at least one of the first substrates 10 is electrically connected to more than two of the second substrates 20.

Embodiment Seven

A control system including the driver controller integrated board 100 in any one of embodiments one to five is provided. The control system uses the driver controller integrated board 100 so that the overall structure of the system can be more compact, more design space is provided for the actuating part, and the overall design difficulty of the device can be reduced, which is conducive to the miniaturization of the device.

Optionally, as shown in FIG. 10, the control system further includes a signal adapter board 200, a second low-voltage power supply 300, and a second high-voltage power supply 400, where two driver controller integrated boards 100 are provided, and one driver controller integrated board 100, the signal adapter board 200, the second low-voltage power supply 300, the second high-voltage power supply 400, and the other driver controller integrated board 100 are cascaded in sequence. The signal adapter board 200 is configured to transmit signals between the driver controller integrated board 100 and the external device. The driver controller integrated board 100, the signal adapter board 200, the second low-voltage power supply 300, the second high-voltage power supply 400, and the other driver controller integrated board 100 are adjacent to each other in sequence. Therefore, in the first aspect, the connection distance between one driver controller integrated board 100 and the signal adapter board 200 can be reduced; in the second aspect, the second low-voltage power supply 300 is close to one driver controller integrated board 100, and the second high-voltage power supply 400 is close to the other driver controller integrated board 100 so that power can be supplied to the two driver controller integrated boards 100 in a more efficient and reliable manner; in the third aspect, the second low-voltage power supply 300, the second high-voltage power supply 400, and other structures can be used to isolate the two driver controller integrated boards 100, thereby reducing the mutual interference between the two driver controller integrated boards 100 and ensuring the working reliability of each of the two driver controller integrated boards 100.

Optionally, the driver controller integrated board 100 adjacent to the signal adapter board 200 is configured to implement only a control function and may be replaced with a conventional single control board; and the driver controller integrated board 100 adjacent to the second high-voltage power supply 400 is configured to implement only a drive function and may be replaced with a conventional single drive board.

Optionally, the signal adapter board 200 is electrically connected to the two driver controller integrated boards 100 and configured to convert a signal from the driver controller integrated board 100 and transmit the converted signal to the external device, or the signal adapter board 200 is configured to convert a signal from the external device and transmit the converted signal to the driver controller integrated board 100. The second low-voltage power supply 300 is electrically connected to the driver controller integrated board 100 close to the signal adapter board 200 and configured to supply power to the driver controller integrated board 100 close to the signal adapter board 200. The second high-voltage power supply 400 is electrically connected to the driver controller integrated board 100 close to the second high-voltage power supply 400 and configured to supply power to the driver controller integrated board 100 close to the second high-voltage power supply 400.

Optionally, in the case where the driver controller integrated board 100 includes the first low-voltage power supply and the first high-voltage power supply, for the driver controller integrated board 100 close to the signal adapter board 200, the first low-voltage power supply of the driver controller integrated board 100 close to the signal adapter board 200 or the second low-voltage power supply may be used to supply power to the driver controller integrated board 100 close to the signal adapter board 200. For example, a selector switch is disposed at the output terminal of the first low-voltage power supply or the output terminal of the second low-voltage power supply and determines a low-voltage power supply that supplies power to the driver controller integrated board 100. Similarly, for the driver controller integrated board 100 close to the second high-voltage power supply 400, the first high-voltage power supply of the driver controller integrated board 100 close to the second high-voltage power supply 400 or the second high-voltage power supply may be used to supply power to the driver controller integrated board 100 close to the second high-voltage power supply 400.

Optionally, the control system further includes two heat sinks, where one of the two heat sinks is located on a side of one driver controller integrated board 100 facing away from the signal adapter board 200, and the other one of the two heat sinks is located on a side of the other driver controller integrated board 100 facing away from the second high-voltage power supply 400. The two heat sinks are disposed on the outer side of two ends of the control system and adjacent to one driver controller integrated board 100 separately, which is conducive to improving the heat dissipation effect.

Figure 13:
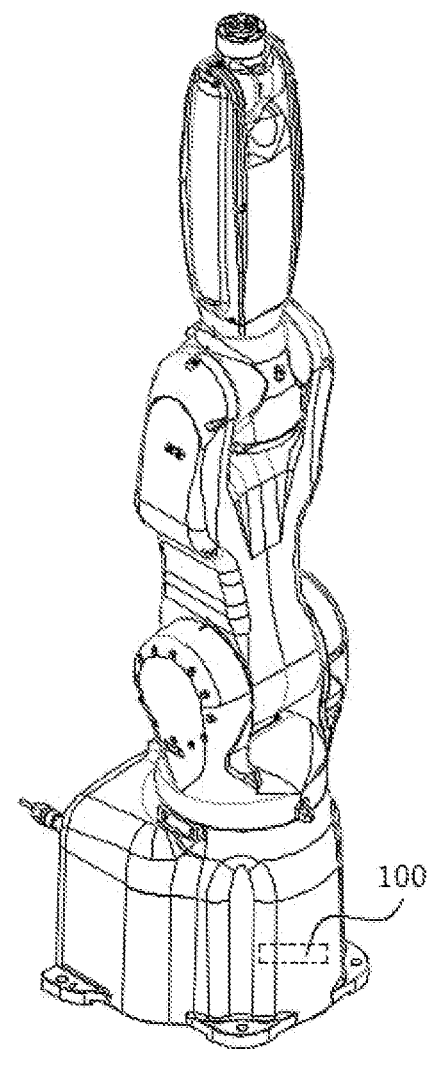
FIG. 13 is a structural view of a robot according to an embodiment.

This embodiment further provides a robot including the preceding control system. The robot is a six-shaft robot as shown in FIG. 13, and the control system is applicable to a variety of shapes, structures, and models of the six-shaft robot. The robot may also be any of a two-shaft robot, a three-shaft robot, a four-shaft robot, a five-shaft robot, a multi-shaft robot, a selective compliance assembly robot arm (SCARA) robot, or a Delta robot, and the control system is applicable to a variety of shapes, structures, and models of the two-shaft robot, three-shaft robot, four-shaft robot, five-shaft robot, multi-shaft robot, SCARA robot, and Delta robot.

Embodiment Eight

A control system including the driver controller integrated board in any one of embodiments one to five is provided. The control system uses the driver controller integrated board so that the overall structure of the system can be more compact, more design space is provided for the actuating part, and the overall design difficulty of the device can be reduced, which is conducive to the miniaturization of the device.

Optionally, the control system further includes a connecting seat, a signal adapter board, a second low-voltage power supply, and a second high-voltage power supply, two driver controller integrated boards are provided and parallel to each other on the connecting seat, the signal adapter board is mounted on a side of one driver controller integrated board facing away from the connecting seat, the second low-voltage power supply is mounted on a side of the signal adapter board facing away from the connecting seat, and the second high-voltage power supply is mounted on a side of the other driver controller integrated board facing away from the connecting seat. The signal adapter board is configured to transmit signals between the driver controller integrated board and the external device. One driver controller integrated board, the signal adapter board, and the second low-voltage power supply are adjacent to each other in sequence, and the other driver controller integrated board is adjacent to the second high-voltage power supply. Therefore, on the one hand, the connection distance between one driver controller integrated board and the signal adapter board can be reduced; on the other hand, the second low-voltage power supply is close to one driver controller integrated board, and the second high-voltage power supply is close to the other driver controller integrated board so that power can be supplied to the two driver controller integrated boards in a more efficient and reliable manner.

Optionally, the driver controller integrated board adjacent to the signal adapter board is configured to implement only a control function and may be replaced with a conventional single control board; and the driver controller integrated board adjacent to the second high-voltage power supply is configured to implement only a drive function and may be replaced with a conventional single drive board.

Optionally, the signal adapter board is electrically connected to the two driver controller integrated boards and configured to convert a signal from the driver controller integrated board and transmit the converted signal to the external device, or the signal adapter board is configured to convert a signal from the external device and transmit the converted signal to the driver controller integrated board. The second low-voltage power supply is electrically connected to the driver controller integrated board close to the signal adapter board and configured to supply power to the driver controller integrated board close to the signal adapter board. The second high-voltage power supply is electrically connected to the driver controller integrated board close to the second high-voltage power supply and configured to supply power to the driver controller integrated board close to the second high-voltage power supply.

Optionally, the control system further includes two heat sinks, where one heat sink is located on a side of one driver controller integrated board facing away from the other driver controller integrated board, that is, the two heat sinks are located on the outer side of the two driver controller integrated boards parallel to each other. The two heat sinks are disposed on the outer side of two ends of the control system, and one heat sink is adjacent to one driver controller integrated board, which is conducive to improving the heat dissipation effect.

Figure 14:
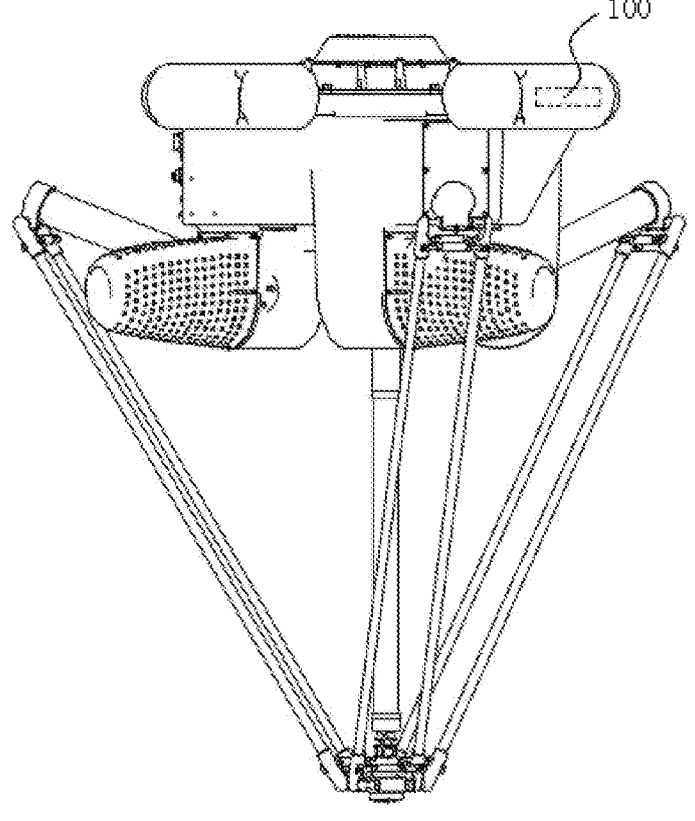
FIG. 14 is another structural view of a robot according to an embodiment.

This embodiment further provides a robot including the preceding control system. The robot is the Delta robot as shown in FIG. 14, and the control system is applicable to a variety of shapes, structures, and models of the Delta robot. The robot may be any of the two-shaft robot, the three-shaft robot, the four-shaft robot, the five-shaft robot, the six-shaft robot, the multi-shaft robot, or the SCARA robot, and the control system is applicable to a variety of shapes, structures, and models of the two-shaft robot, three-shaft robot, four-shaft robot, five-shaft robot, six-shaft robot, multi-shaft robot, and SCARA robot.

Embodiment Nine

A control system including the driver controller integrated board 100 in any one of embodiments one to five is provided. The control system uses the driver controller integrated board 100 so that the overall structure of the system can be more compact, more design space is provided for the actuating part, and the overall design difficulty of the device can be reduced, which is conducive to the miniaturization of the device.

Optionally, as shown in FIG. 11, more than two driver controller integrated boards 100 are provided, and all the driver controller integrated boards 100 are spaced apart along a column, stacked, and connected in cascade in sequence. Each driver controller integrated board 100 can control one actuating part separately. This cascading layout can make the control system more compact, facilitate the centralized layout of drive control structures corresponding to all actuating parts, and improve the convenience of later maintenance. Specifically, all the driver controller integrated boards 100 are spaced apart along a column and stacked, that is, forming a distribution structure similar to multiple lines parallel to each other.

Optionally, any driver controller integrated board 100 is capable of acting as a master control board, is configured to control the signals from all the driver controller integrated boards 100, and is connected to an external device signal; or all the driver controller integrated boards 100 are configured to be connected to a cloud controller, where the cloud controller is configured to control the signals from all the driver controller integrated boards 100 and is connected to an external device signal. The preceding design can enable the driver controller integrated board 100 to be externally connected to achieve the linkage between different robots.

Optionally, the control system further includes a connecting seat 600, where the connecting seat 600 includes more than two first cascade sockets 601 for the driver controller integrated boards 100 to be plugged in, and all the first cascade sockets 601 are spaced apart from each other by an equal distance along a column and connected in cascade in sequence, or all the first cascade sockets 601 are spaced apart along two columns, stacked, and connected in cascade in sequence.

The connecting seat 600 with the first cascade sockets 601 is provided. Therefore, on the one hand, the installation reliability of the driver controller integrated board can be improved; on the other hand, the quick assembly and disassembly of the driver controller integrated board 100 and the connecting seat 600 can be facilitated, thereby improving the convenience and flexibility of using different driver controller integrated boards in combination.

Optionally, the control system further includes a connecting plate 500, where the connecting plate 500 and the driver controller integrated boards 100 are spaced apart and stacked, the connecting plate 500 includes a third control part 501 and a third substrate 502, the third control part 501 is disposed on the third substrate 502, multiple driver controller integrated boards 100 are connected in cascade in sequence, and the third control part 501 is electrically connected to at least one driver controller integrated board 100. The third control part 501 electrically connected to the driver controller integrated board 100 is provided so that the total control of all the driver controller integrated boards 100 can be achieved, the signal interaction between different driver controller integrated boards 100 is coordinated, and a comprehensive and reliable control of the control system to the actuating part is achieved.

Optionally, the connecting plate 500 is disposed on a side of the whole formed by all the driver controller integrated boards 100 located in a column, facilitating the connection between the connecting plate 500 and an external controller.

Optionally, the connecting plate 500 further includes a second communication module 503, where the second communication module 503 is disposed on the third substrate 502, and the third control part 501 is electrically connected to the second communication module 503. The second communication module 503 can achieve remote interaction between the third control part 501 and the external device, thereby improving the efficiency of interconnection between the control system and the external device.

Optionally, the control system further includes the connecting seat 600, where the connecting seat 600 includes more than two first cascade sockets 601 for the driver controller integrated boards 100 to be plugged in and one second cascade socket 602 for the connecting plate 500 to be plugged in, all the first cascade sockets 601 are spaced apart from each other by an equal distance along a column and connected in cascade in sequence, and the second cascade socket 602 is electrically connected to at least one first cascade socket 601. The connecting seat 600 with the first cascade sockets 601 and the second cascade socket 602 is provided. Therefore, on the one hand, the installation reliability of the driver controller integrated board 100 and the connecting plate 500 can be improved; on the other hand, the quick assembly and disassembly of the driver controller integrated board, the connecting plate 500, and the connecting seat 600 can be facilitated, thereby improving the convenience and flexibility of using different driver controller integrated boards 100 and the connecting plate 500 in combination.

Optionally, the second cascade socket 602 is disposed on a side of the whole formed by the first cascade sockets 601 in a column, facilitating the connection between the second cascade socket 602 and the external controller.

Optionally, the second cascade socket 602 is electrically connected to the first cascade socket 601 adjacent to the second cascade socket 602.

Optionally, the control system further includes a thermostat, where the thermostat can perform high-temperature protection on the driver controller integrated board 100. The thermostat is provided so that the control system can be prevented from working in an overheated state, thereby effectively extending the service life of the control system.

Figure 15:
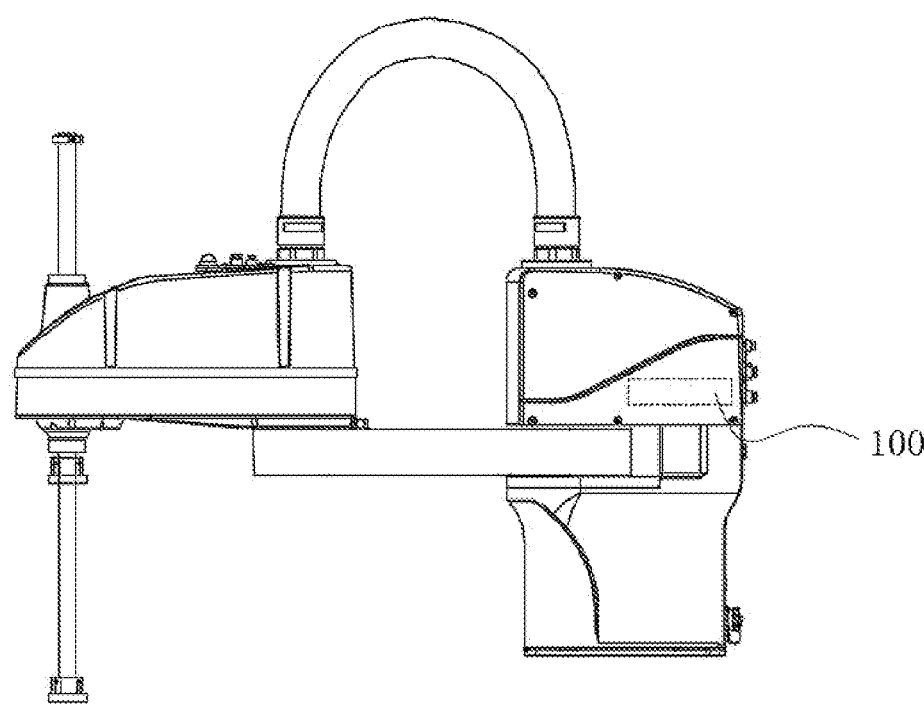
FIG. 15 is another structural view of a robot according to an embodiment.

This embodiment further provides a robot including the preceding control system. The robot is the SCARA robot as shown in FIG. 15, and the control system is applicable to a variety of shapes, structures, and models of the SCARA robot. The robot may also be any of the two-shaft robot, the three-shaft robot, the four-shaft robot, the five-shaft robot, the six-shaft robot, the multi-shaft robot, or the Delta robot, and the control system is applicable to a variety of shapes, structures, and models of the two-shaft robot, three-shaft robot, four-shaft robot, five-shaft robot, six-shaft robot, multi-shaft robot, and Delta robot.

Embodiment Ten

This embodiment differs from embodiment nine in the aspects described below.

The control system further includes the connecting seat 600, where the connecting seat 600 includes more than two first cascade sockets 601 for the driver controller integrated boards 100 to be plugged in, all the first cascade sockets 601 are spaced apart from each other by an equal distance along a column and connected in cascade in sequence or all the first cascade sockets 601 are spaced apart along two columns, stacked, and connected in cascade in sequence, the connecting plate 500 is welded or affixed to the connecting seat 600, and the connecting plate 500 is electrically connected to at least one first cascade socket 601. The connecting plate 500 is welded or affixed to the connecting seat 600, thereby improving the connection reliability between the connecting plate 500 and the connecting seat 600 and improving the working reliability of the whole control system.

Optionally, the connecting plate 500 is disposed on a side of the whole formed by all the first cascade sockets 601 located in a column, facilitating the connection between the connecting plate 500 and the external controller.

Optionally, the connecting plate 500 is electrically connected to the first cascade socket 601 adjacent to the connecting plate 500.

Embodiment Eleven

This embodiment differs from embodiment nine in that the connecting seat 600 is replaced with the design described below.

The control system further includes a main substrate, where the connecting plate 500 and/or all the driver controller integrated boards 100 are welded or affixed to the main substrate. The driver controller integrated board 100 is welded or affixed to the main substrate, thereby improving the connection reliability between the driver controller integrated board 100 and the main substrate and improving the working reliability of the whole control system.

Embodiment Twelve

Referring to FIG. 16, the present application provides a control system. The control system includes a control function board 1', a drive function board 2', a signal adapter board 3', a second low-voltage power supply 4', and a second high-voltage power supply 5', where the control function board 1', the drive function board 2', the signal adapter board 3', the second low-voltage power supply 4', and the second high-voltage power supply 5' are connected in a daisy chain. The daisy chain is used to achieve the connection of the control function board 1', the drive function board 2', and other devices so that the control function board 1', the drive function board 2', and the like form an efficient interconnected drive control integrated system, which is conducive to the miniaturization of the control system. The signal adapter board 3' is configured to achieve the signal input and output connection between the control function board 1', the drive function board 2', and the external device.

Optionally, one control function board 1' is provided, one drive function board 2' is provided, and the control function board 1', the signal adapter board 3', the second low-voltage power supply 4', the second high-voltage power supply 5', and the drive function board 2' are cascaded in sequence. The structures cascaded in sequence are adopted so that in the first aspect, the connection distance between the control function board 1' and the signal adapter board 3' can be reduced; in the second aspect, the control function board 1' and the drive function board 2' can be isolated, the mutual interference between the control function board 1' and the drive function board 3' can be reduced, and the respective working reliability can be ensured; in the third aspect, the second low-voltage power supply 4' is close to the control function board and the second high-voltage power supply 5' is close to the drive function board 2' so that power can be supplied to the control function board 1' and the drive function board 2' in a more efficient and reliable manner.

Optionally, the signal adapter board 3' is electrically connected to the control function board 1' and the drive function board 2', is configured to convert a signal from the control function board 1' and transmit the converted signal to the external device or convert the signal from the external device and transmit the converted signal to the control function board 1', and is configured to convert a signal from the drive function board 2' and transmit the converted signal to the external device or convert the signal from the external device and transmit the converted signal to the drive function board 2'. The second low-voltage power supply 4' is electrically connected to the control function board 1' and configured to supply power to the control function board 1', and the second high-voltage power supply 5' is electrically connected to the drive function board 2' and configured to supply power to the drive function board 2'.

Optionally, the control system further includes two heat sinks, where one of the two heat sinks is located on a side of one control function board facing away from the signal adapter board, and the other one of the two heat sinks is located on a side of the driver controller integrated board facing away from the second high-voltage power supply. The two heat sinks are disposed on the outer side of two ends of the control system and adjacent to the control function board and the drive function board separately, which is conducive to improving the heat dissipation effect.

Optionally, the control function board and/or the drive function board are the driver controller integrated boards of embodiment one, two, three, four, or five described above.

Embodiment Thirteen

This embodiment differs from embodiment nine in the aspects described below.

More than two driver controller integrated boards are provided, and all the driver controller integrated boards are spaced apart along two columns, stacked, and connected in cascade in sequence. Each driver controller integrated board can control one actuating part separately. This cascading layout can make the control system more compact, facilitate the centralized layout of drive control structures corresponding to all actuating parts, and improve the convenience of later maintenance. All the driver controller integrated boards are spaced apart along two columns and stacked, that is, forming a distribution structure similar to the Chinese character " 非 ".

Optionally, the control system further includes a connecting seat, where the connecting seat includes more than two first cascade sockets for the driver controller integrated boards to be plugged in and one second cascade socket for the connecting plate to be plugged in, all the first cascade sockets are spaced apart along two columns, stacked, and connected in cascade in sequence, and the second cascade socket is electrically connected to at least one first cascade socket.

In the description here, it is to be understood that orientations or position relations indicated by terms such as "upper", "lower", "left", and "right" are based on the drawings. These orientations or position relations are intended only to facilitate description and simplify operations and not to indicate or imply that a device or element referred to must have such particular orientations or must be configured or operated in such particular orientations. Thus, these orientations or position relations are not to be construed as limiting the present application. In addition, the terms "first" and "second" are used only to distinguish between descriptions and have no special meaning.

In the description of the specification, the description of reference terms "an embodiment" or "example" means that specific characteristics, structures, materials, or features described in connection with the embodiment or example are included in at least one embodiment or example of the present application. In the specification, the illustrative description of the preceding terms does not necessarily refer to the same embodiment or example.

What is claimed is:

1. A control system, comprising a driver controller integrated board;

wherein the driver controller integrated board comprises a control module, a drive module, and a first substrate, wherein the control module and the drive module are disposed on the first substrate, and the control module is electrically connected to the drive module;

wherein at least two driver controller integrated boards are provided, and all the at least two driver controller integrated boards are spaced apart along a column, stacked, and connected in cascade in sequence, or all the at least two driver controller integrated boards are spaced apart along two columns, stacked, and connected in cascade in sequence;

wherein any of the at least two driver controller integrated boards is capable of acting as a master control board, is configured to control signals from all the at least two driver controller integrated boards, and is connected to an external device signal; or all the at least two driver controller integrated boards are configured to be connected to a cloud controller, wherein the cloud controller is configured to control signals from all the at least two driver controller integrated boards and is connected to an external device signal.

2. The control system of claim 1, further comprising a signal adapter board, a second low-voltage power supply, and a second high-voltage power supply, wherein two driver controller integrated boards are provided, and one of the two driver controller integrated boards, the signal adapter board, the second low-voltage power supply, the second high-voltage power supply, and another one of the two driver controller integrated boards are cascaded in sequence;

preferably, further comprising two heat sinks, wherein one of the two heat sinks is located on a side of one of the two driver controller integrated boards facing away from the signal adapter board, and another one of the two heat sinks is located on a side of another one of the two driver controller integrated boards facing away from the second high-voltage power supply.

3. The control system of claim 1, further comprising a connecting plate, wherein the connecting plate and the at least two driver controller integrated boards are spaced apart and stacked, the connecting plate comprises a third control part and a third substrate, the third control part is disposed on the third substrate, the at least two driver controller integrated boards are connected in cascade in sequence, and the third control part is electrically connected to at least one of the at least two driver controller integrated boards;

preferably, wherein the connecting plate further comprises a second communication module, wherein the second communication module is disposed on the third substrate, and the third control part is electrically connected to the second communication module.

4. The control system of claim 1, further comprising a connecting seat, wherein the connecting seat comprises at least two first cascade sockets for the at least two driver controller integrated boards to be plugged in, and all the at least two first cascade sockets are spaced apart from each other by an equal distance along a column and connected in cascade in sequence, or all the at least two first cascade sockets are spaced apart along two columns, stacked, and connected in cascade in sequence.

5. The control system of claim 3, further comprising a connecting seat, wherein the connecting seat comprises at least two first cascade sockets for the at least two driver controller integrated boards to be plugged in and one second cascade socket for the connecting plate to be plugged in, all the at least two first cascade sockets are spaced apart from each other by an equal distance along a column and connected in cascade in sequence or all the at least two first cascade sockets are spaced apart along two columns, stacked, and connected in cascade in sequence, and the second cascade socket is electrically connected to at least one of the at least two first cascade sockets;

preferably, wherein the second cascade socket is electrically connected to one of the at least two first cascade sockets adjacent to the second cascade socket.

6. The control system of claim 3, further comprising a connecting seat, wherein the connecting seat comprises at least two first cascade sockets for the at least two driver controller integrated boards to be plugged in, all the at least two first cascade sockets are spaced apart from each other by an equal distance along a column and connected in cascade in sequence or all the at least two first cascade sockets are spaced apart along two columns, stacked, and connected in cascade in sequence, the connecting plate is welded or affixed to the connecting seat, and the connecting plate is electrically connected to at least one of the at least two first cascade sockets;

preferably, wherein the connecting plate is electrically connected to one of the at least two first cascade sockets adjacent to the connecting plate.

7. The control system of claim 1, further comprising at least one of the following:

a main substrate, wherein all the at least two driver controller integrated boards are welded or affixed to the main substrate; or a thermostat, wherein the thermostat is configured to perform high-temperature protection on the driver controller integrated board.

8. The control system of claim 1, wherein the driver controller integrated board further comprising one of the following:

an isolation device, wherein the isolation device is disposed between the drive module and the control module;

a safety circuit module, wherein the safety circuit module is disposed on the first substrate and electrically connected to at least one of the control module or the drive module;

a thermal insulation member, wherein the thermal insulation member is disposed between the drive module and the control module;

a first communication module disposed on the first substrate, wherein the first communication module is electrically connected to the control module, preferably, wherein the first communication module is configured to be connected to a network bus.

9. The control system of claim 1, wherein an isolation groove is opened on the first substrate and located between the drive module and the control module;

preferably, wherein a plurality of isolation grooves are disposed between the drive module and the control module; or a plurality of spacers are disposed in the isolation groove.

10. The control system of claim 1, wherein the drive module is disposed near an edge of a first end of the first substrate, and the control module is disposed near an edge of a second end of the first substrate; or wherein the drive module is configured to be connected to an external strong power supply.

11. The control system of claim 1, wherein the control module and the drive module are disposed on a same side of the first substrate; or the control module is disposed on a first side of the first substrate, and the drive module is disposed on a second side of the first substrate; or the control module comprises a first control part and a second control part, wherein the first control part is disposed on a first side of the first substrate, the second control part and the drive module are disposed on a second side of the first substrate, the first control part and the second control part are electrically connected, and at least one of the first control part or the second control part is connected to the drive module; or the drive module comprises a first drive part and a second drive part, wherein the first drive part is disposed on a first side of the first substrate, the second drive part and the control module are disposed on a second side of the first substrate, the first drive part and the second drive part are electrically connected, and at least one of the first drive part or the second drive part is connected to the control module.

12. The control system of claim 1, further comprising a first low-voltage power supply and a first high-voltage power supply that are disposed on the first substrate, wherein the control module, the first low-voltage power supply, the first high-voltage power supply, and the drive module are adjacent to each other in sequence, or the control module, the first low-voltage power supply, the drive module, and the first high-voltage power supply are adjacent to each other in sequence;

preferably, wherein the driver controller integrated board further comprises an input/output (I/O) interface, wherein the I/O interface is electrically connected to the control module;

further preferably, wherein the I/O interface is disposed on a side of the control module facing away from the drive module; or the I/O interface is disposed on a side of the control module facing the drive module; or the I/O interface is disposed on a side of the first low-voltage power supply facing the drive module.

13. The control system of claim 12, further comprising two heat dissipation assemblies, wherein the two heat dissipation assemblies are disposed on the first substrate, one of the two heat dissipation assemblies is located on a side of the control module facing away from the drive module, and another one of the two heat dissipation assemblies is located on a side of the drive module facing away from the control module.

14. The driver controller integrated board of claim 1, further comprising at least one heat dissipation assembly, wherein the at least one heat dissipation assembly is disposed on the first substrate;

preferably, wherein each of the at least one heat dissipation assembly comprises a heat dissipation base plate and a plurality of cooling fins, wherein the heat dissipation base plate is mounted on the first substrate, and the plurality of cooling fins are mounted on the heat dissipation base plate;

further preferably, wherein the heat dissipation base plate abuts against at least one of the drive module or the control module;

further preferably, wherein the heat dissipation base plate is connected to at least one of the control module or the drive module through thermally conductive silicone.

15. The driver controller integrated board of claim 8, wherein the drive module fits the first substrate, the first communication module fits a side of the drive module facing away from the first substrate, and the control module fits a side of the first communication module facing away from the first substrate.

16. The driver controller integrated board of claim 1, wherein the control module fits the first substrate, and the drive module is parallel to the control module and fits the first substrate; or the control module fits the first substrate, and the drive module fits a side of the control module facing away from the first substrate; or the drive module fits the first substrate, and the control module fits a side of the drive module facing away from the first substrate.

17. A control system, comprising a driver controller integrated board, wherein the driver controller integrated board comprises a first substrate and a second substrate that are integrated, wherein the first substrate is a control function board, the second substrate is a drive function board, and the first substrate is electrically connected to the second substrate;

wherein at least two driver controller integrated boards are provided, and all the at least two driver controller integrated boards are spaced apart along a column, stacked, and connected in cascade in sequence, or all the at least two driver controller integrated boards are spaced apart along two columns, stacked, and connected in cascade in sequence;

wherein any of the at least two driver controller integrated boards is capable of acting as a master control board, is configured to control signals from all the at least two driver controller integrated boards, and is connected to an external device signal; or all the at least two driver controller integrated boards are configured to be connected to a cloud controller, wherein the cloud controller is configured to control signals from all the at least two driver controller integrated boards and is connected to an external device signal.

18. The driver controller integrated board of claim 17, wherein the second substrate and the first substrate are stacked, or the second substrate is configured to be connected to an external strong power supply;

preferably, wherein the second substrate fits and is connected to the first substrate in a daisy chain.

19. The driver controller integrated board of claim 17, wherein, a number of first substrates is equal to a number of second substrates, and the first substrates are electrically connected to the second substrates in one-to-one correspondence; or a number of first substrates is less than a number of second substrates, and at least one of the first substrates is electrically connected to at least two of the second substrates;

or, the driver controller integrated board further comprises one of the following:

an isolation device, wherein the isolation device is disposed between the second substrate and the first substrate;

a thermal insulation member, wherein the thermal insulation member is disposed between the second substrate and the first substrate; or a communication module, wherein the communication module is electrically connected to the first substrate; preferably, wherein the communication module is configured to be connected to a network bus.

20. The driver controller integrated board of claim 17, further comprising a first low-voltage power supply and a first high-voltage power supply, wherein the first substrate, the first low-voltage power supply, the first high-voltage power supply, and the second substrate are adjacent to each other in sequence, or the first substrate, the first low-voltage power supply, the second substrate, and the first high-voltage power supply are adjacent to each other in sequence;

preferably, further comprising an input/output (I/O) interface, wherein the I/O interface is electrically connected to the first substrate;

further preferably, wherein the I/O interface is disposed on a side of the first substrate facing away from the second substrate; or the I/O interface is disposed on a side of the first substrate facing the second substrate; or the I/O interface is disposed on a side of the first low-voltage power supply facing the second substrate.

21. The driver controller integrated board of claim 17, further comprising at least one heat dissipation assembly configured to dissipate heat from at least one of the first substrate or the second substrate;

preferably, wherein two heat dissipation assemblies are provided, one of the two heat dissipation assemblies is located on a side of the first substrate facing away from the second substrate, and another one of the two heat dissipation assemblies is located on a side of the second substrate facing away from the first substrate; or wherein one heat dissipation assembly is provided, wherein the heat dissipation assembly is disposed between the second substrate and the first substrate; or the heat dissipation assembly abuts against the first substrate; or the heat dissipation assembly abuts against the second substrate; or wherein each of the at least one heat dissipation assembly comprises a heat dissipation base plate and a plurality of cooling fins, wherein the heat dissipation base plate is mounted on one of the second substrate or the first substrate, the plurality of cooling fins are mounted on the heat dissipation base plate, and another one of the second substrate or the first substrate fits the plurality of cooling fins; preferably, wherein the heat dissipation base plate is connected to the first substrate or the second substrate through thermally conductive silicone; or wherein each of the at least one heat dissipation assembly further comprises a cooling fan, wherein the cooling fan is mounted on a side of the plurality of cooling fins and capable of driving gas to flow in a region where the plurality of cooling fins are located.

22. A control system, comprising a control function board, a drive function board, a signal adapter board, a second low-voltage power supply, and a second high-voltage power supply, wherein the control function board, the drive function board, the signal adapter board, the second low-voltage power supply, and the second high-voltage power supply are connected in a daisy chain;

at least one of the control function board or the drive function board is a driver controller integrated board, wherein the driver controller integrated board comprises a control module, a drive module, and a first substrate, wherein the control module and the drive module are disposed on the first substrate, and the control module is electrically connected to the drive module;

wherein one control function board is provided, one drive function board is provided, and the control function board, the signal adapter board, the second low-voltage power supply, the second high-voltage power supply, and the drive function board are cascaded in sequence, or the control function board, the signal adapter board, the second low-voltage power supply, the drive function board, and the second high-voltage power supply are cascaded in sequence;

the control system further comprises two heat sinks, wherein one of the two heat sinks is located on a side of the control function board facing away from the drive control board, and another one of the two heat sinks is located on a side of the drive function board facing away from the control function board.

* * * * *